US 9,711,677 B2

(12) United States Patent
Spotti et al.

(10) Patent No.: US 9,711,677 B2
(45) Date of Patent: Jul. 18, 2017

(54) ASSEMBLY METHOD OF A PHOTOVOLTAIC PANEL OF THE BACK-CONTACT TYPE WITH PRE-FIXING OF THE CELLS, AND COMBINED LOADING AND PRE-FIXING STATION

(71) Applicant: VISMUNDA SRL, Venice (IT)

(72) Inventors: Davide Spotti, Triest (IT); Elisa Baccini, Carbonera (IT)

(73) Assignee: VISMUNDA SRL, Venice (IT)

( * ) Notice: Subject to any disclaimer, the term of this patent is extended or adjusted under 35 U.S.C. 154(b) by 0 days.

(21) Appl. No.: 15/036,280

(22) PCT Filed: Dec. 17, 2014

(86) PCT No.: PCT/IB2014/002802
§ 371 (c)(1),
(2) Date: May 12, 2016

(87) PCT Pub. No.: WO2015/097518
PCT Pub. Date: Jul. 2, 2015

(65) Prior Publication Data
US 2016/0300976 A1    Oct. 13, 2016

(30) Foreign Application Priority Data
Dec. 23, 2013  (IT) ............................. TV2013A0211

(51) Int. Cl.
*H01L 31/18*    (2006.01)
*H01L 31/048*   (2014.01)
(Continued)

(52) U.S. Cl.
CPC .......... *H01L 31/188* (2013.01); *H01L 31/048* (2013.01); *H01L 31/049* (2014.12);
(Continued)

(58) Field of Classification Search
CPC .............. H01L 31/188; H01L 31/1876; H01L 31/022425; H01L 31/048; H01L 31/0504; H01L 31/0236; H01L 31/0516
See application file for complete search history.

(56) References Cited

U.S. PATENT DOCUMENTS

2003/0127124 A1*  7/2003  Jones .................... H01L 31/188
                                            136/244
2007/0029901 A1   3/2007  White et al.
(Continued)

FOREIGN PATENT DOCUMENTS

EP      2353797 A1    8/2011
WO    2009029901 A1   3/2009

OTHER PUBLICATIONS

International Search Report for corresponding International Application No. PCT/IB2014/002802.

*Primary Examiner* — Jaehwan Oh
(74) *Attorney, Agent, or Firm* — Egbert Law Offices, PLLC (57) ABSTRACT

Automatic assembly method of a photovoltaic panel with cells of the back-contact type provided with a conductive backsheet with a thermoplastic encapsulating layer; the loading of the cells occurs in combination with their pre-fixing in a combined station sequentially placed before the superimposition of the upper encapsulating layer and after the laying of the conductive adhesive. The loading is carried out with a first device of the automatic mechanical hand type which takes a group of cells, aligns them with the back contacts in correspondence of the holes and lays them vertically from above. Furthermore, a second device of the presser-heater type carries out the pre-fixing of the cells holding them in the final position also with localized heating on at least one portion of each cell in such a way as to activate the adhesive function of the underlying thermoplas- (Continued)

tic encapsulating layer. A combined loading and pre-fixing station is also disclosed.

4 Claims, 4 Drawing Sheets

(51) Int. Cl.
*H01L 31/05* (2014.01)
*H01L 31/049* (2014.01)

(52) U.S. Cl.
CPC ...... *H01L 31/0516* (2013.01); *H01L 31/1864* (2013.01); *H01L 31/1876* (2013.01); *Y02E 10/50* (2013.01); *Y02P 70/521* (2015.11)

(56) References Cited

U.S. PATENT DOCUMENTS

| | | | | |
|---|---|---|---|---|
| 2011/0017281 A1* | 1/2011 | Funakoshi | ........ | H01L 31/02008 136/251 |
| 2011/0100417 A1* | 5/2011 | Jang | ............ | H01L 31/0516 136/244 |
| 2012/0000502 A1* | 1/2012 | Wiedeman | ............ | H01L 31/048 136/244 |
| 2012/0048334 A1* | 3/2012 | Cohen | ............ | H01L 31/048 136/244 |
| 2012/0285501 A1* | 11/2012 | Zhao | ............ | H01L 31/0516 136/244 |
| 2012/0291838 A1* | 11/2012 | Jang | ............ | H01L 31/022441 136/244 |
| 2013/0104957 A1* | 5/2013 | Koyuncu | ............ | H01L 21/268 136/244 |
| 2013/0160813 A1* | 6/2013 | Natarajan | ............ | H01L 31/0516 136/244 |
| 2014/0190545 A1* | 7/2014 | Lei | ............ | H01L 31/0516 136/244 |
| 2014/0326295 A1* | 11/2014 | Moslehi | ............ | H01L 31/02245 136/249 |
| 2014/0370650 A1* | 12/2014 | Moslehi | ............ | H01L 31/18 438/98 |
| 2015/0171240 A1* | 6/2015 | Kapur | ............ | H01L 31/022441 438/72 |
| 2015/0280039 A1* | 10/2015 | Baccini | ............ | H01L 31/0203 438/66 |
| 2015/0333204 A1* | 11/2015 | Baccini | ............ | B32B 37/142 438/66 |
| 2016/0064575 A1* | 3/2016 | Baccini | ............ | H01L 31/02013 136/256 |
| 2016/0087579 A1* | 3/2016 | Moslehi | ............ | H01L 31/0516 136/251 |

* cited by examiner

ASSEMBLY METHOD OF A PHOTOVOLTAIC PANEL OF THE BACK-CONTACT TYPE WITH PRE-FIXING OF THE CELLS, AND COMBINED LOADING AND PRE-FIXING STATION

The present invention relates to an assembly method of a photovoltaic panel with back-contact solar cells of crystalline silicon, provided with a conductive backsheet with thermoplastic encapsulating material; in particular, said method comprises the loading with the simultaneous pre-fixing of the cells before superimposing the upper encapsulating layer. The present invention also relates to a combined loading and pre-fixing station of said cells.

FIELD OF THE INVENTION

The invention finds particular application in the industrial sector of production of photovoltaic panels, with specific reference to the modern photovoltaic panels with back-contact cells; said panels have at the back a multi-layer component which integrates the electrical contacts and is conventionally called backsheet of the conductive type. The present invention solves a typical problem of the assembly of said photovoltaic panels of the back-contact type and is particularly suitable to be integrated in a production process for automatic systems with stations in sequence.

Nowadays, in principle, it is possible to consider as widely known the advantages provided by the known solutions of photovoltaic panels having cells of the back-contact type. For example, we recall an evolved solution of said panels whose basic components are described in detail in the following starting from the back side towards the front side exposed to the sun:

- a backsheet of the back-contact type, also called conductive backsheet or BC, which includes an internal conductive metal layer for the electrical connection of said cells of the back-contact type, said layer being generally made by rolling with following selective removal in such a way as to make a circuit which will electrically connect in series the solar cells placed thereon. Today such a configuration is widely known because various solutions are available, such as milling, etching, cutting, lasering, selective deposition on said BS or other equivalent solutions;
- a plurality of photovoltaic cells of the back-contact type, of single-crystal or multi-crystal silicon, having the contacts with both positive and negative electrical polarity placed at the back; for example, one should remember the known cell structures which are called Metal Wrap Through, also known by the acronym MWT, or even the cells called Emitter Wrap Through, also known by the acronym EWT, or still the cells called Interdigitated Back Contact also, known by the acronym IBC. In patent literature various solutions of cells of the back-contact type are known, such as the solutions as in US2004261840 (Schmit et al.) or in EP2212915 (Mihailetchi);
- a conductive material between said BC and the back faces of the cells, in correspondence of the contacts of different electrical polarity of the cells themselves, being for example of the type called Electronic Conductive Adhesive or ECA, or of the welding paste type or other equivalent materials; said material being generally applied by silkscreen printing or with a dispensing unit with a system of the ink-jetting type or with other equivalent laying solutions;
- two layers of encapsulating material, generally ethyl vinyl acetate, which is also known by the acronym EVA, the back layer of which is holed in correspondence of the contacts created by said conductive material, enclosing at the front and at the back all the elements described above;
- an insulating material which is generally superimposed by silkscreen printing on said BC having openings in correspondence of the zones of contact with the back polarities of said cells;
- a flat glass, a frame and a junction box as described above.

In particular, it is known that the production process of such a panel of the back-contact type allows to reduce manual working, increasing the degree of industrialization and repeatability.

PRIOR ART

For the purpose of determining the prior art related to the proposed solution a conventional check was made, searching public archives, which has led to find some prior art documents, among which:

D1: EP2139050 (Bakker et al.)
D2: WO2012058053 (Meakin et al.)
D3: ITTV2012A000211 (Baccini et al.)
D4: WO2011071373 (Bakker et al.)

D1 proposes an assembly process for panels of the back-contact type starting from a conductive backsheet of the conventional type placed with the conductive layer upwards on which the conductive adhesive material is placed and then the lower encapsulating layer is superimposed which is holed, matching the holes with said conductive material; then one lays the cells, the upper encapsulating layer and the glass to be then subjected to the final rolling.

D2 describes the following process for panels of the back-contact type: laying of conductive ribbons on a backsheet on which some adhesive material has been previously applied, such as EVA; laying of dielectric material on the conductive ribbons; laying of conductive material, such as ECA, on the conductive ribbons however without specifying with which positioning logic; laying of cells, upper EVA layer, glass and final rolling.

Figure 1:
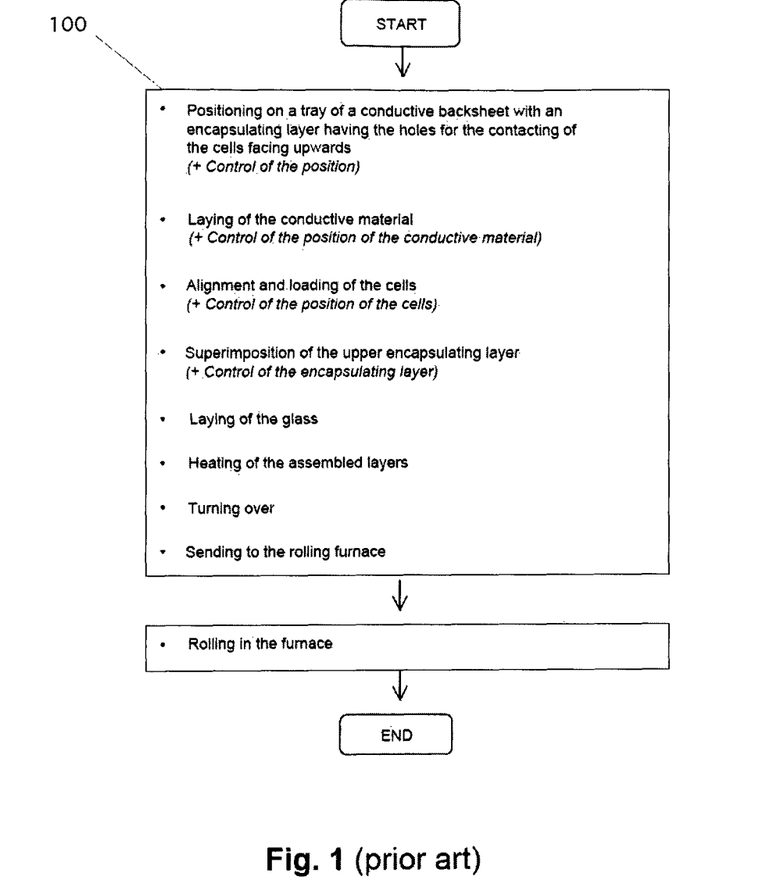
FIG. 1 schematically shows an assembly method of a photovoltaic panel with a back-contact architecture starting from a conductive backsheet with encapsulating material, according to the prior art as for example in D3.

D3 proposes a fully automatic assembly process starting from a particular conductive backsheet with an integrated encapsulating and dielectric layer, conventionally called BCBS and made separately to be considered as a purchase component, which allows to realize an innovative and advantageous photovoltaic panel structure of the back-contact type with greater production quality and lower industrial costs. Said BCBS is mad up of a double layer of encapsulating material with interposed dielectric, holed and joined to the conductive sheet of the supporting backsheet; on said BCBS placed horizontally on a tray with the conductive layer upwards and with the contacting areas of the cells already masked it is therefore possible to lay directly and automatically a conductive material like ECA, with dispensing of the type called drop by drop; afterwards one lays the cells, the upper encapsulating layer and the glass, to be then subjected to the final rolling. The invention also provides, prior to the turning over, to use a heating source which allows the encapsulating layers to stick to each other to enable the turning over without offsetting or detachments of the components; see prior art table (FIG. 1).

D4 describes a process of the type proposed in D1 which also provides increased stability for the purpose of allowing the movements and turning over without relative sliding between the components; in particular, prior to said turning over and final rolling, the invention proposes a phase of softening by partial melting of the thermoplastic layers placed under and over the cells with subsequent fixing by cooling, substantially carrying out a pre-rolling of the assembled layers.

In conclusion, it is reasonable to consider as known:
- a photovoltaic panel with cells of the back-contact type and a supporting backsheet comprising the electrical circuits, on which one then lays in sequence: the layer of dielectric material as an insulating mask, the conductive material, the lower encapsulating layer with centring of the holes on the contacts, the cells, the upper encapsulating layer, the glass;
- systems and processes for the assembly of said panel;
- a particular and advantageous solution of a panel with cells of the back-contact type which comprises a conductive backsheet of the evolved type called BCBS, which integrates the functions of dielectric mask and of lower encapsulating layer;
- a system and a process for the fully automatic assembly of a panel with back-contact cells starting from a conductive backsheet of the BCBS type already made;
- the use of a heating source prior to the turning over in such a way as to allow the encapsulating layers to stick to each other to enable the turning over without offsetting or detachments of the components.

Drawbacks

In conclusion, we have observed that the known solutions described have some drawbacks or anyway some limits.

Firstly, in the known processes of assembly of photovoltaic panels of the back-contact type a high degree of instability has been found in the relative positioning between the various multi-layer components during the movements. In particular it has been found that, after the loading phase, the solar cells are not fixed and can move during the working processes prior to rolling; also in the improvement solutions, such as in D3 and D4, the cells are not fixed until the specific additional phase of stabilization by heating of all the multi-layer components, immediately prior to the turning over. Such a configuration implies the fact that said cells can easily move or rotate during the assembly of the module, as sometimes occurs for example during the phase of completion of the positioning of all the cells or during the phase of laying of the upper encapsulating layer, or still during the phase of laying of the glass. In particular, it is widely known that the movement or the relative rotation of one or more cells causes at least one aesthetic damage to the look of the finished panel or an alteration of the electrical contacting, sometimes leading to the serious lack of electrical contact or even to the dangerous short-circuit between opposite polarities on the back face of one or more cells. It is also known that such serious problems lead to the realization of a defective panel; among all the defects, those concerning electrical contacting are particularly serious as they are difficult to find, if not after the final rolling, that is to say, when the panel is not reprocessable.

Secondly, it has been found that said simultaneous heating of the lower and upper encapsulating layer already assembled is disadvantageous because the material of which the upper encapsulating layer is made, generally EVA, is not normally of the thermoplastic type and, therefore, if it is preheated it substantially deteriorates altering its behaviour in an irreversible way. In more detail, it generally happens that when the cross-linking of the polymer chains begins, there is a loss of the peroxides with which it is normally charged in order to obtain a given cross-linking profile, for example to control the temperature and time parameters.

This problem does not occur, on the Other hand, if the lower encapsulating layer is made up of a thermoplastic material and therefore its heating does not cause any loss or change in the behaviour, keeping its physical-chemical characteristics unchanged also during the real final rolling phase.

Furthermore, it has also been found that said practice established in the known art to pre-heat the multi-layer set prior to the turning over implies a dedicated working phase with a possible increase in times and industrial costs.

Hence the need for the companies of the sector to find solutions which are more effective with respect to the existing solutions; the aim of the present invention is also to solve the described drawbacks.

SHORT DESCRIPTION OF THE INVENTION

This and other aims are achieved by the present invention according to the characteristics as in the appended claims, solving the arising problems by means of an automatic assembly method of a photovoltaic panel with cells of the back-contact type provided with a conductive backsheet with thermoplastic encapsulating material; the loading of the cells is carried out in combination with their pre-fixing in a combined station sequentially placed before the superimposition of the upper encapsulating layer and after the laying of the conductive adhesive. Said loading is carried out with a first device of the automatic mechanical hand type which takes a group of cells, aligns them with the back contacts in correspondence of the holes and lays them vertically from above; furthermore, a second device of the presser-heater type carries out the pre-fixing of said cells holding them in, the final position also with localised heating on at least one portion of each cell in such a way as to activate the adhesive function of the underlying thermoplastic encapsulating material. The invention also describes the combined loading and pre-fixing station.

Aims

In this way by the considerable creative contribution the effect of which has allowed to reach a considerable technical progress, some aims and advantages are achieved solving the main problems mentioned above, and in particular eliminating the causes of waste or reprocessing.

A first aim of the present invention was to prevent any translation or rotation of the cells immediately after the laying on the conductive backsheet with holed encapsulating layer, with particular reference to the matching of the contacts in the lower surface of the cells in contact with the underlying encapsulating material, and in particular during the movements related to the various assembly phases. In more detail, said aim was achieved by activating the adhesive function of said encapsulating material, being in contact with the lower surface of the cells and also joined to said conductive backsheet.

A second aim of the present invention, linked to said first aim, was to ensure, immediately after the laying on the holed lower encapsulating layer, the correct and stable contacting of said cells of the back-contact type.

A third aim of the present invention was to obtain an advantageous solution which does not imply an increase in time for the assembly of the panel because said operation of fixing of the cells occurs with an alternate sequential logic with respect to the loading, that is to say, regaining the time necessary to take the cells of the following loading after the laying on the conductive backsheet, therefore in the operating mode called "shadow" with respect to said loading phase.

Furthermore, an aim of the present invention was to make the assembly of photovoltaic panels with a back-contact architecture, with a conductive backsheet, considerably more robust, repeatable and safe from the point of view of the industrial process and with remarkable progress and usefulness.

These and other advantages will appear from the following detailed description of some preferred embodiments, with the aid of the schematic drawings enclosed whose details of execution are not to be considered limitative but only illustrative.

DESCRIPTION OF AT LEAST ONE EMBODIMENT OF THE INVENTION

The present invention describes an advantageous assembly method (10, 11) of a photovoltaic panel with solar cells of crystalline silicon of the back-contact type, said method being intended to prevent any translation or rotation of the cells during the movements related to the following working phases. The invention provides, in particular, that the loading of the cells occurs with the simultaneous pre-fixing (11) of the cells themselves and before superimposing the upper encapsulating layer; such a solution improves product quality reducing industrial costs, and substantially makes useless the conventional heating phase of the assembled layers which is generally carried out prior to the turning over, as described above. The invention, moreover, describes a particular combined station (20) intended to carry out said loading and pre-fixing of the cells, allowing to perform in an automated way said assembly method.

In particular, said assembly method (10, 11) and said combined station (20) object of the present invention are intended to be advantageously integrated in an automated production process of the type described in said document ITTV2012A000211 (Baccini et al.). In more detail, the invention describes the assembly of a photovoltaic panel with solar cells (306) of crystalline silicon of the back-contact type which are loaded and also pre-fixed on a conductive backsheet (300) comprising a thermoplastic encapsulating layer (304) on top of the conductive layer (302); said encapsulating layer (304) has holes (305) in correspondence of the back contacts (307) of the cells, while said conductive layer (302) has openings (303) which configure it according to the specific circuit which will electrically connect the subsequently superimposed cells. For example, such a conductive backsheet can advantageously be of the type called BCBS, described in said document ITTV2012A000211 (Baccini et at); furthermore, the encapsulating layer can advantageously be of the type called Stack, described in ITVI2012A000133 (Baccini et al.).

The following terms and acronyms, therefore, in the description have the following meanings:

backsheet: supporting and closing sheet which is placed at the back of the panel;

conductive backsheet: backsheet for cells of the back-contact type which integrates the electrical circuits which realize the electrical connection in series of the solar cells placed thereon;

BCBS: a particular conductive backsheet with an integrated encapsulating and dielectric layer, a semi-finished composite and multifunction element which industrially simplifies the assembly of the panels with a back-contact architecture;

back-contact: photovoltaic cells having the contacts with both positive and negative electrical polarity placed at the back, as a consequence also the panels comprising such cells are defined as back-contact panels;

Stack: a multi-layer semi-finished element, in a coil, made up of two layers of encapsulating material, in particular of the thermoplastic type in the present invention, with an interposed dielectric layer; said multi-layer element being holed in correspondence of the electrical contacts. For the purpose of the present invention, as an alternative one can also use an equivalent solution of the single-layer and multifunction type which combines the adhesive and encapsulating behaviour with the dielectric insulating function, for example by means of a film polymer particularly charged with materials with dielectric characteristics to perform such functions.

Figure 2:
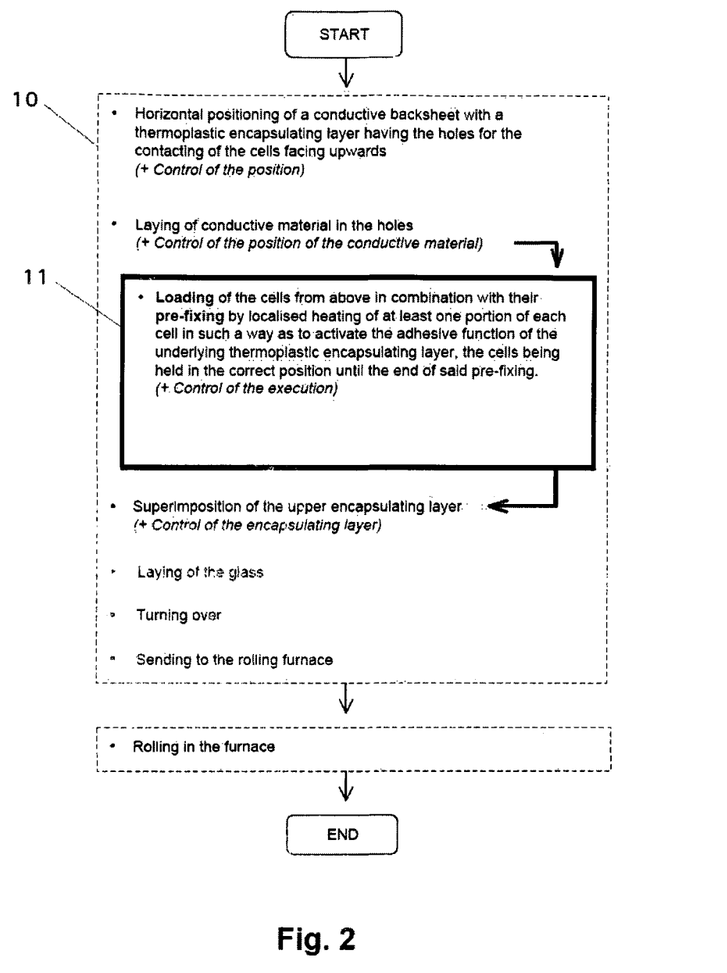
FIG. 2 schematically shows the assembly method of a photovoltaic panel with a back-contact architecture starting from a conductive backsheet with thermoplastic encapsulating material, according to the present invention; in particular, the loading of the cells occurs in combination with their simultaneous pre-fixing before superimposing the upper encapsulating layer.

In more detail, as to the innovative characteristics of the invention (10, 41), it is observed that the loading of the cells advantageously occurs in combination with their pre-fixing with localised heating, said loading and said pre-fixing being simultaneous to and coordinated with each other; to this purpose, said loading and said pre-fixing are carried out in a combined station (20) which is placed sequentially before the superimposition of the upper encapsulating layer and after the laying of the conductive adhesive (FIG. 2).

Said automatic assembly method (10, 11) therefore includes the following operating steps (FIG. 2):

horizontal positioning, for example on a tray, of a conductive backsheet (300) with the encapsulating layer (304) having the holes (305) for the contacting of the cells (306) facing upwards, also with the control of the position, according to the prior art;

laying of the conductive adhesive, also with the control of the position of the conductive material, according to the prior art;

innovative combined phase (11) of loading of the cells from above, with a picking device of the mechanical hand type with pneumatic vacuum, in combination with the pre-fixing with localised heating from above of at least one portion (229, S) of cell (306) and of the underlying thermoplastic encapsulating material (304) in such a way as to activate the adhesive function of said encapsulating material, it being possible to carry out said phase by means of an innovative combined loading and pre-fixing station (20, 210, 220), with the related control of the execution;

loading of the front encapsulating layer, with related control, according to the prior art;

laying of the front glass, according to the prior art;
turning over of all the multi-layer components without previously carrying out the conventional heating to prevent any possible offsetting or detachments, said heating being substantially useless and harmful for EVA;
sending to the rolling furnace and final rolling, according to the prior art.

Figure 3:
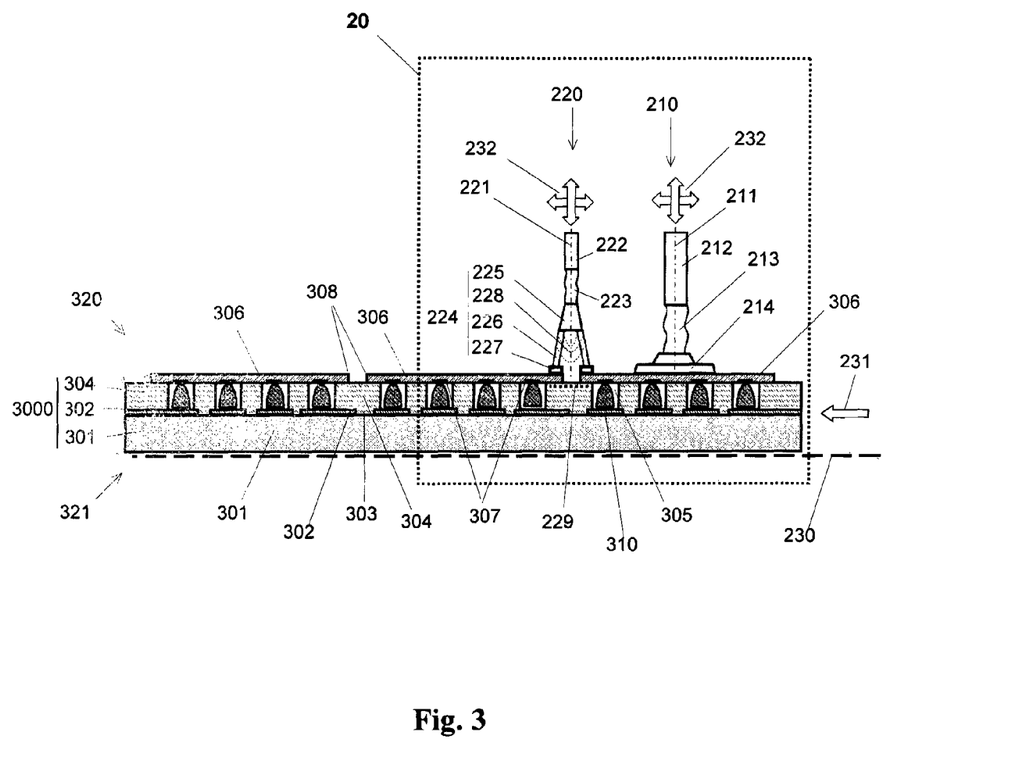
FIG. 3 shows a schematic sectional view of the combined loading and pre-fixing station of the cells, according to the present invention.

Said loading of the cells (306) is carried out by means of a first device (210) of the automatic mechanical hand type, which takes the cells from any storage, generally adjacent to said combined station (20), aligns them with the back contacts (307) in correspondence of the holes (305) and lays them vertically from above onto said thermoplastic encapsulating material (304). After said laying of the cells (306), a second device (220) of the presser-heater type carries out said pre-fixing of the cells (306) holding them and generating localised heating on at least one portion of each cell in such a way as to activate the adhesive function of the underlying thermoplastic encapsulating material (304). To this purpose, said second device (220) holds each cell being heated in its correct position until the end of the execution of said pre-fixing (FIGS. 2, 3).

In particular, it is observed that said first device (210) and said second device (220) are coordinated with each other to operate on the same cells (306) in an alternate sequential way, said pre-fixing being carried out by said second device (220) after said first device (210) has completed the loading, that is to say, while said first device (210) goes back to prepare the following loading.

In the preferred embodiment of the invention (FIG. 3) said second device (220) performs said localised heating from the top downwards on at least one portion of each cell (306) and in correspondence of at least one rectilinear edge (308) of said cell without comprising the back contacts (307), in order not to alter the performances of the conductive adhesive or the shape of the contacts. The pressing means (226) which hold the cell and the heating means (228) which perform said localised heating are preferably integrated in a same multifunction head (224-8), included in said second device (220). Said pressing means (226) are intended to press vertically a fragile flat object without damaging it, such as mechanical elements of the conventional type which are cushioned and provided with an anti-scratch end (227). Said heating means (228) are intended to obtain temperatures between 50° C. and 130° C. below the cells and activate the adhesive function of the thermoplastic encapsulating material (304) underlying the cells; as a non-exhaustive example, heating means (228) suitable for this purpose are of the type: infrared lamps or lamps with another wavelength, or resistors, or still inductors.

In particular, said localised heating is started within 10 seconds from the laying of the single cell (306) in its final position and is completed in a time between 0.5 seconds and 10 seconds. To this purpose, for example, lamps are used which are intended to emit a localised heating beam from the top downwards, having a power between 1 kW and 4.5 kW and being arranged at a distance between 5 mm and 60 mm from the visible surface of the cells (306); in an alternative solution resistors are used which have a power between 100 W and 200 W, preferably 150 W, arranged at a distance smaller than 20 mm from the front surface of the cells (306, 320). In an advantageous embodiment, said resistors are included within the pressers (226) or anti-scratch ends (227), in contact with the cell, coated with a polymer of the anti-stick and heat-resistant type based on tetrafluoroethylene.

Figure 4:
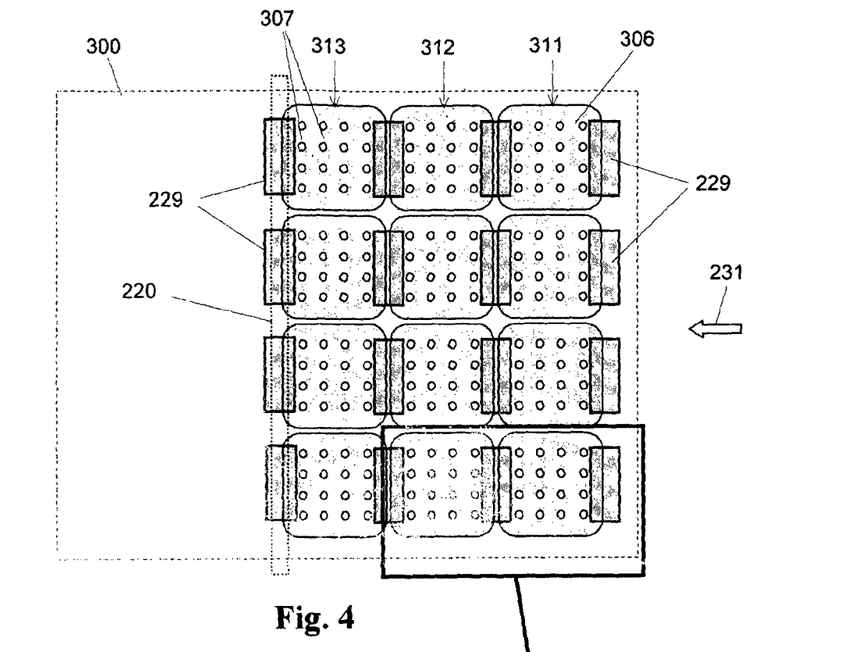
FIG. 4 shows a schematic view from the top of the cells arranged in parallel rows, during the loading with pre-fixing, in the combined station of FIG. 3.

The invention provides that said pre-fixing is carried out on one cell at a time or on a group of cells together, for example one parallel row (311-3) at a time (FIG. 4), according to the strategy used for the loading on the conductive backsheet (300). Furthermore, for the whole duration of the localised heating, all the cells (306) subjected to the pre-fixing are held in their final position in contact with the underlying thermoplastic encapsulating layer (304), for the purpose of preventing any possible relative movements between the cells due to the deformation of the underlying materials and also, in particular, preventing any translation or rotation of the cells in the following working phases up to the rolling of the whole module.

In the preferred but not exclusive embodiment (FIGS. 4, 5) said cells (306) are loaded by said first device (210) one row at a time (311-3) in a parallel way, being therefore held by said pressing means (226) on the edge of each cell, near the heated area (229, S), by means of said second device (220); said first and second device (210, 220) having supporting elements (212, 222) similar and parallel to each other, for example shaped as a mobile horizontal bar, to operate alternatively on the same rows (311-3).

In more detail (FIGS. 4, 5), the second device (220) carries out said pre-fixing simultaneously on all the cells (306) of two adjacent rows (311-2) positioning itself parallel and symmetrically midway between the two rows; said pre-fixing is carried out while the first device (210) prepares the loading of the following row (313). To this purpose, said second device (220) comprises an elongated supporting element (222) which has a plurality of said multifunction heads (224) with interposed elastic elements (223); each of said multifunction heads (224) acts on an adjacent pair of cells (306), belonging to two parallel rows (311-2), along the closest respective parallel edges in such a way that with a head (224) and a heating means (228) one simultaneously carries out the pre-fixing of two portions of adjacent cells being included in the same heated area (229). Each cell (306) will be subjected to an additional fixing in correspondence of a similar second portion of cell, symmetrically opposite (229, S), which is obtained by said second device (220) during the following working process, after the loading of the following row (313).

Figure 5:
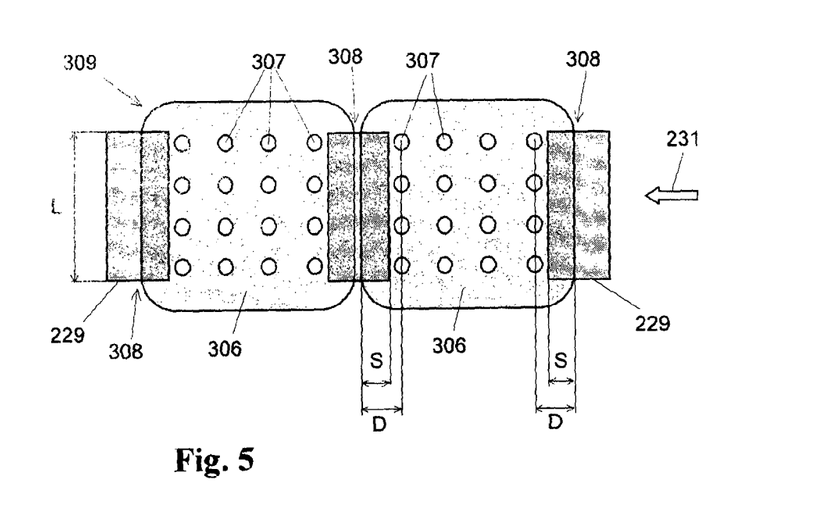
FIG. 5 shows an enlarged detail of two adjacent cells, as in FIG. 4, with the heated areas according to the present invention.

In particular, in said preferred solution said pre-fixing is carried out in correspondence of the superimposed portion (S) of the heated area (229) which is superimposed in a symmetrical way on the rectilinear edges (308) closest to each other of a pair of adjacent cells (306, 311-2), said area (229) being limited in this way: the width (L) is equal to or smaller with respect to the length of the rectilinear portion of the edge (308) of the cell (306), the superimposed portion (S) is equal to or smaller than 80% of the distance (D) between the edge (308) and the centre of the back contact (307) (FIG. 5).

In this way it is prevented that said heated area (229) comprises the back contacts (307) in order not to deteriorate the conductive adhesive (310) and it is also prevented to comprise the possible curved section (309) of the edge or the central part of the cell (306) in order not to cause anomalous expansions in the underlying materials.

Furthermore, as regards said combined loading and pre-fixing station (20) of the cells (FIG. 3), the invention provides a configuration which can be easily integrated in an automated production system of the type described in said document ITTV2012A000211 (Baccini et al.), comprising at least:
one horizontal supporting surface (230) of the conductive backsheets (300) with the encapsulating layer (304)

facing upwards, optionally provided with a conventional movement system (231);

above said supporting surface (230) two devices (210, 220) are arranged which are combined in their interaction with each other, being coordinated in the operating sequence and simultaneously arranged above said supporting surface (230), with a vertical working axis (211, 221) to operate orthogonally together on the front side (320) of the cells (306), from the top downwards, being adjacent and substantially parallel to each other, also being intended to perform horizontal and vertical movements of positioning (232);

the first combined device (210) carries out the loading from above of the cells (306), being of the automatic mechanical hand type with pneumatic vacuum provided with at least one main support (212), for example in the form of a mobile bar, with at least one elastic element (213) and a cell picking end (214) shaped as a sucker flat or conical head, which is intended to take and load the single cells or the groups of cells aligning them, positioning them and laying them correctly. To this purpose, the cells (306) are loaded with the sensitive side (320) facing upwards and the back contacts (307) facing downwards (321) in correspondence of the holes (305) on the encapsulating layer (304) which is on top of the conductive layer (302), the conductive adhesive (310) having already been laid during the previous assembly phase;

the second combined device (220) which carries out the pre-fixing of the cells (306), being of the presser-heater type and being intended to hold said cells while it performs localised heating in correspondence of at least one portion (229, S) of each cell (306) in such a way as to activate the adhesive function of the underlying thermoplastic encapsulating layer (304); said second device (220) is intended to hold each cell (306) subjected to heating in the final position until the end of said pre-fixing. To this purpose said second device (220) is provided with at least one main support (222), for example in the form of a mobile bar; with at least one elastic element (223) and at least one multifunction head (224-8) comprising pressing means (226) which are intended to hold the cells (306), anti-scratch ends (227) in contact with the cells (306), heating means (228) intended for the localised heating (228). Said second device preferably has a plurality of said multifunction heads (224-8) according to the number of cells, for example considered individually, in pairs or in groups;

one electronic control system for industrial automation, not shown in the reference figures and integrated in the control system which manages the entire system, which is intended to adjust at least the operation of said combined devices (210, 220).

control means for controlling the carrying out of the operations, not shown in the reference figures, integrated in said electronic control system for industrial automation, related at least to the positioning of the cells (306).

For example, said electronic control system of the combined station (20) is intended to adjust the operation of said devices (210, 220) in such a way as to start the pre-fixing of the group of cells within 10 seconds from their loading in the final position, carry out said pre-fixing in a time between 0.5 seconds and 10 seconds, hold in a continuous way the loaded cells (306) until the end of said pre-fixing and also manage in an autonomous way said pressing means (226) and heating means (228).

For the purpose of lowering industrial costs, also saving the space occupied by the system and the related investment, it is provided that some of the above-described phases related to the automatic assembly method of a photovoltaic panel, instead of being carried out in different stations, as explained above for the sake of simplicity, can advantageously be concentrated and/or integrated although keeping the single functions and the logical sequence of the production method unchanged, in particular with reference to the loading with pre-fixing of the cells.

By the assembly method (10, 11) and the combined loading and pre-fixing station (20) described above it is possible to solve in an industrially advantageous way, according to the pre-set aims, the problems of waste and reprocessing linked to the translations or rotations of the cells immediately after the laying on the holed first encapsulating layer and during the movements related to the various assembly phases.

REFERENCE (10) automatic assembly method of a photovoltaic panel with back-contact cells of crystalline silicon, with pre-fixing of the cells on the underlying thermoplastic encapsulating layer;
(100) automatic assembly method of a photovoltaic panel with back-contact cells of crystalline silicon, starting from a conductive backsheet with encapsulating layer, according to the prior art.
(11) method for pre-fixing the back contact cells of crystalline silicon during the automatic assembly of a photovoltaic panel starting from a conductive backsheet with a thermoplastic encapsulating layer;
(20) combined loading and pre-fixing station of the cells;
(210) first device for loading the cells, of the automatic mechanical hand type with pneumatic vacuum, being combined with the second device;
(211, 221) vertical working axis;
(212, 222) main supporting element;
(213, 223) elastic element;
(214) cell picking end;
(220) second device for pre-fixing the cells, of the presser-heater type intended for the localised heating and for the holding in position, being combined with the first device;
(224) multifunction head integrating heating and pressing means;
(225) connection element;
(226) pressing means, intended for the holding of the cell;
(227) anti-scratch end;
(228) heating means, intended for the localised heating of the cells;
(229) heated area;
(230) horizontal supporting surface;
(231) direction of movement of the panel;
(232) movement of the device on horizontal-vertical axes, for positioning;
(300) conductive backsheet comprising encapsulating material;
(301) supporting and protection backsheet;
(302) conductive metal layer which electrically connects the photovoltaic cells;
(303) openings which configure the conductive layer according to the specific circuit which will electrically connect the subsequently superimposed cells;

(304) encapsulating material of the thermoplastic type;
(305) holes in correspondence of the back contacts of the cells;
(306) photovoltaic cells of the back-contact type;
(307) back contacts of the cells;
(308) rectilinear section of the edge of the cell;
(309) curved section of the edge of the cell;
(310) conductive adhesive;
(311) first row of cells;
(312) second row of cells, parallel and adjacent to the first row;
(313) third row of cells, parallel and adjacent to the second row;
(320) front side facing the sun;
(321) back side;
(D) distance between the rectilinear edge and the centre of the back contact;
(L) width of the heated area;
(S) portion of heated area superimposed to the cell, corresponding to the portion of cell joined to the underlying thermoplastic encapsulating layer.

The invention claimed is:

1. A method for assembling a photovoltaic panel with back-contact cells of crystalline silicon, the method comprising:
   horizontally positioning a conductive back sheet with an encapsulating layer having holes facing upwardly;
   laying a conductive material in the holes;
   loading the back-contact cells such that a sensitive face of the back-contact cells faces upwardly so as to form a front side of the photovoltaic panel and such that contact of the back-contact cells is toward a back side of the photovoltaic panel;
   superimposing an upper encapsulating layer on the photovoltaic panel;
   laying a front glass onto the upper encapsulating layer;
   turning the photovoltaic panel over; and
   moving the turned-over photovoltaic panel to a rolling furnace for a final rolling, the steps of loading and a fixing of the back-contact cells occurring simultaneously with each other in a coordinated manner, the steps of loading and fixing being carried out in a combined station which is sequentially placed before the step of superimposing and after the step of laying of the front glass.

2. The method of claim 1, wherein the loading of the back-contact cells is carried out by a first device which has an automatic mechanical hand, wherein the first device takes the cells and aligns them with the back contacts in correspondence to the holes and lays them vertically from above onto the encapsulating layer, wherein a second device with a presser-heater carries out the pre-fixing of the back-contact cells by holding them and performing localized heating on at least one portion of each back-contact cell so as to activate an adhesive function of the encapsulating layer, wherein said second device holds each back-contact cell in a correct position until the end of the step of prefixing, wherein said second device performs the localized heating downwards with a heater on at least one portion of each back-contact cell in correspondence to at least one rectilinear edge of the back-contact cell and without compromising the back contacts, wherein a pressure of the presser-heater and a heater of the presser-heater are integrated in the same multifunction head which is in said second device, wherein said first device and said second device are coordinated with each other to operate on the same back-contact cells in an alternate sequential manner, the step of prefixing being carried out by said second device after said first device has completed the step of loading.

3. The method of claim 2, wherein said first device loads one row of the back-contact cells at a time, wherein said second device carries out the step of prefixing simultaneously on all the back-contact cells of two adjacent rows while placing itself parallel and symmetrically midway between the two adjacent two rows, the step of prefixing being carried out while said first device prepares the loading of a following row, said second device comprising a supporting element which has a plurality of the multifunction heads, each of the plurality of multifunction heads acting on an adjacent pair of back-contact cells belonging to the two adjacent rows along closest respective parallel edges thereof such that with a head and a heater of the multifunction head simultaneously carries out the step of prefixing two portions of adjacent back-contact cells included in a common heated area, wherein the step of prefixing occurs in correspondence to a superimposed portion of the heated area which is superimposed in a symmetrical manner on the rectilinear edges closest to each other of a pair of adjacent back-contact cells, a width of the heated areas is equal to or less than a length of the rectilinear portion of the edge of the back-contact cell, the superimposed portion is equal to or less than 80% of a distance between the edge and a center of the back contact.

4. The method of claim 3, wherein the localized heating is started within 10 seconds from the step of laying of the back-contact cell in its final position, wherein the localized heating lasts between 0.5 seconds and 10 seconds.

* * * * *